United States Patent
Hanafi

(10) Patent No.: US 8,242,555 B2
(45) Date of Patent: Aug. 14, 2012

(54) FIN FIELD EFFECT TRANSISTOR

(75) Inventor: Hussein I. Hanafi, Basking Ridge, NJ (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/700,913

(22) Filed: Feb. 5, 2010

(65) Prior Publication Data

US 2010/0133617 A1 Jun. 3, 2010

Related U.S. Application Data

(62) Division of application No. 11/851,993, filed on Sep. 7, 2007, now Pat. No. 7,674,669.

(51) Int. Cl.
*H01L 29/66* (2006.01)

(52) U.S. Cl. . 257/328; 257/263; 257/627; 257/E21.207; 438/197; 438/206; 438/212; 438/269; 438/607

(58) Field of Classification Search ............... 257/63, 257/328, 329, 627, E21.207; 438/197, 206, 438/212, 269, 607, 933
See application file for complete search history.

(56) References Cited

U.S. PATENT DOCUMENTS

| | | | |
|---|---|---|---|
| 6,353,249 B1 | 3/2002 | Boyd et al. | |
| 6,635,923 B2 | 10/2003 | Hanafi et al. | |
| 2006/0113522 A1 | 6/2006 | Lee et al. | |
| 2007/0298549 A1 | 12/2007 | Jurczak et al. | |
| 2008/0073667 A1 | 3/2008 | Lochtefeld | |
| 2008/0105900 A1 | 5/2008 | Joshi et al. | |

OTHER PUBLICATIONS

Esseni, D., et al. "An Experimental Study of Low Field Electron Mobility in Double-Gate Ultra-Thin SOI MOSFETs". IDEM Digest, 2001, pp. 445-448.

Hisamoto, Digh, et al. "FinFET—A Self-Aligned Double-Gate MOSFET Scalable to 20 nm". IEEE Trans. Electron Devices, Dec. 2000, vol. 47, pp. 2320-2325.

Hisamoto, Digh, et al. "A Folded-channel MOSFET for Deep-sub-tenth Micron Era". IEDM Tech. Dig., 1998, pp. 1032-1034.

Ismail, K. "Si/SiGe High-Speed Field-Effect Transistors". IEDM Technical Digest, 1995, pp. 509-512.

Kesan, V.P., et al. "High Performance 0.25 um p-MOSFETs with Silicon-Germanium Channels for 300 K and 77K Operation". IEDM Technical Digest, 1991, pp. 25-28.

Ogura, Seiki, et al. "A Half Micron MOSFET Using Double Implanted LDD". IEDM Technical Digest, 1982, pp. 718-721.

Suzuki, Kunihiro, et al. "Scaling Theory for Double-Gate SOI MOSFETs". IEEE Trans. Electron Devices, Dec. 1993, vol. 40, No. 12, pp. 2326-2329.

Taraschi, Gianni, et al. "Relaxed SiGe-on-insulator fabricated via wafer bonding and etch back". Journal of Vacuum Sciences & Technology B: Microelectronics and Nanometer Structures, 2002, vol. 20, Issue 2, pp. 725-725.

*Primary Examiner* — Jarrett Stark
*Assistant Examiner* — John M Parker
(74) *Attorney, Agent, or Firm* — Brooks, Cameron & Huebsch, PLLC

(57) ABSTRACT

Methods, devices and systems for a FinFET are provided. One method embodiment includes forming a FinFET by forming a relaxed silicon germanium ($Si_{1-X}Ge_X$) body region for a fully depleted Fin field effect transistor (FinFET) having a body thickness of at least 10 nanometers (nm) for a process design rule of less than 25 nm. The method also includes forming a source and a drain on opposing ends of the body region, wherein the source and the drain are formed with halo ion implantation and forming a gate opposing the body region and separated therefrom by a gate dielectric.

17 Claims, 15 Drawing Sheets

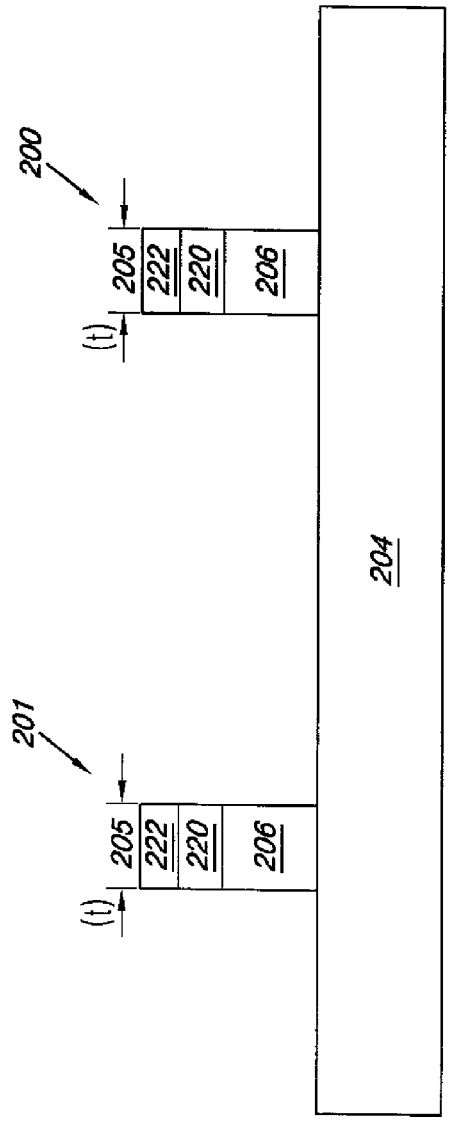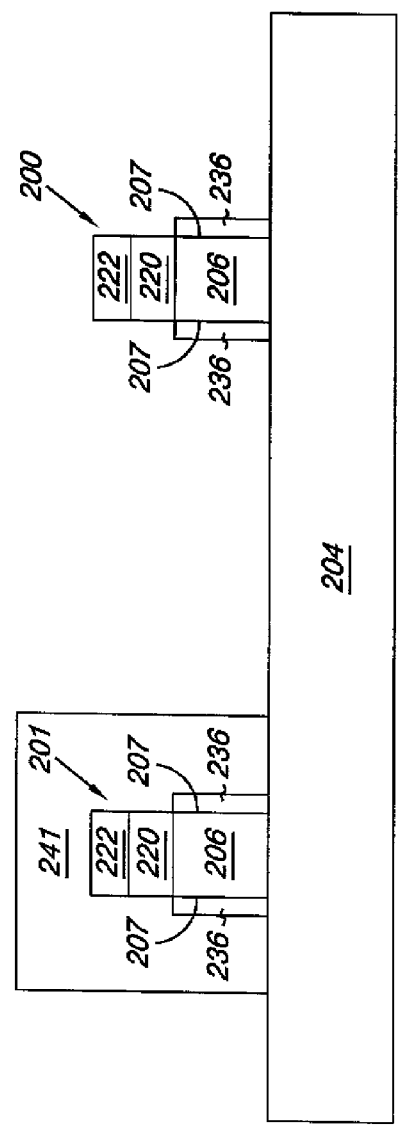

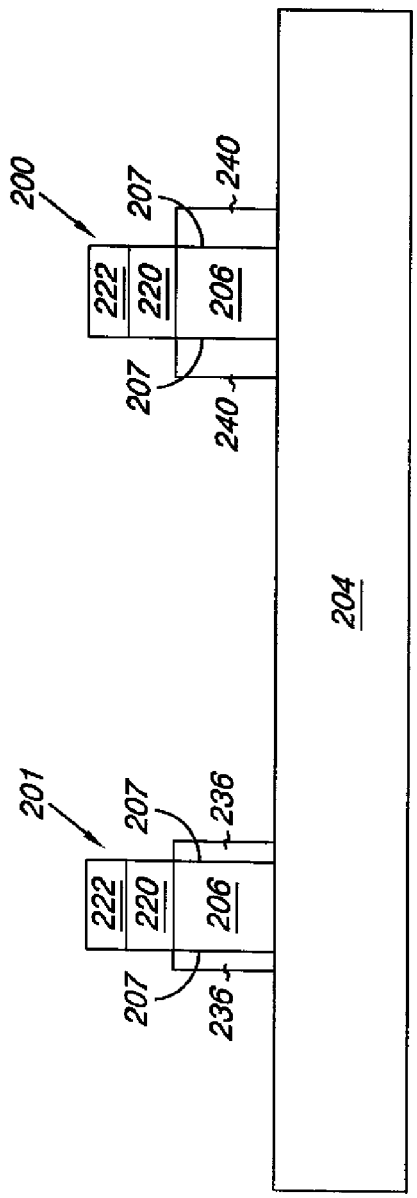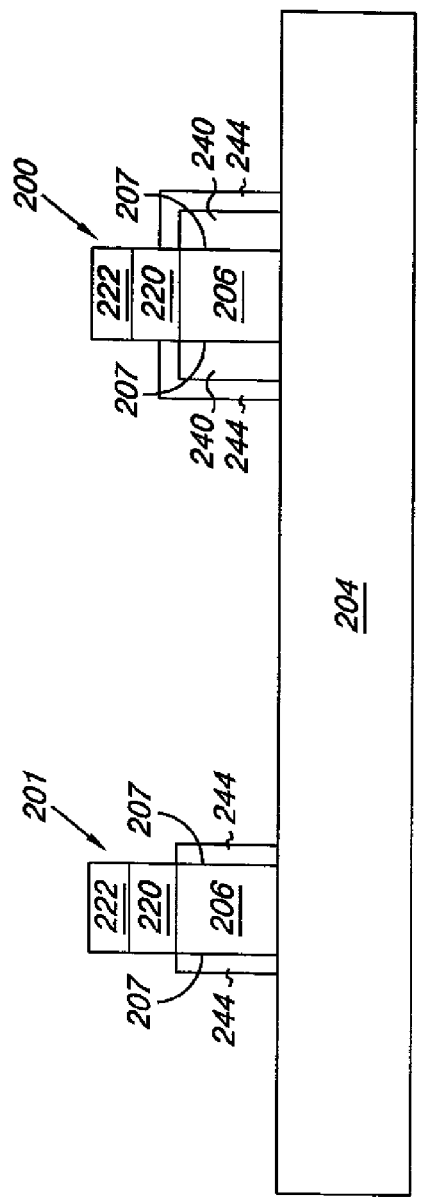

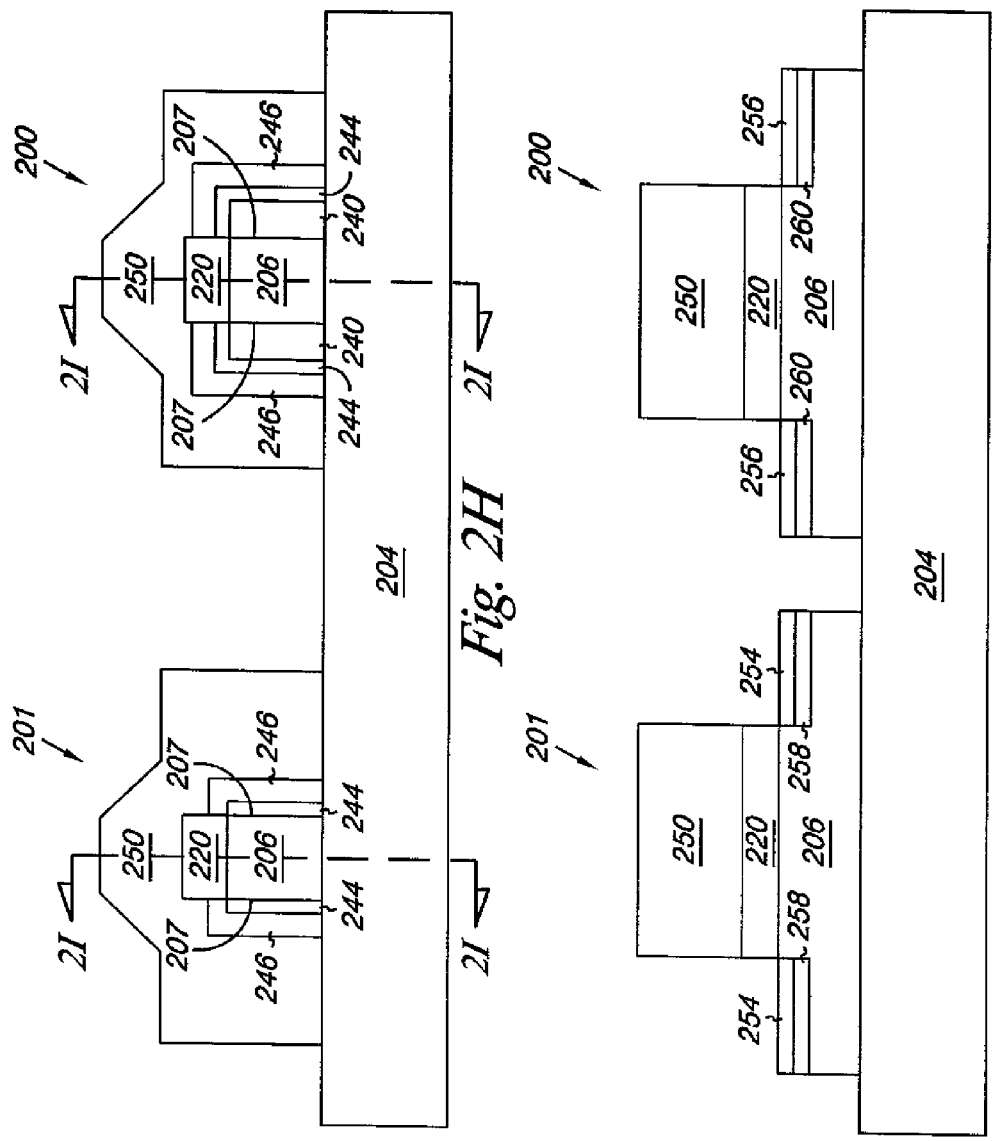

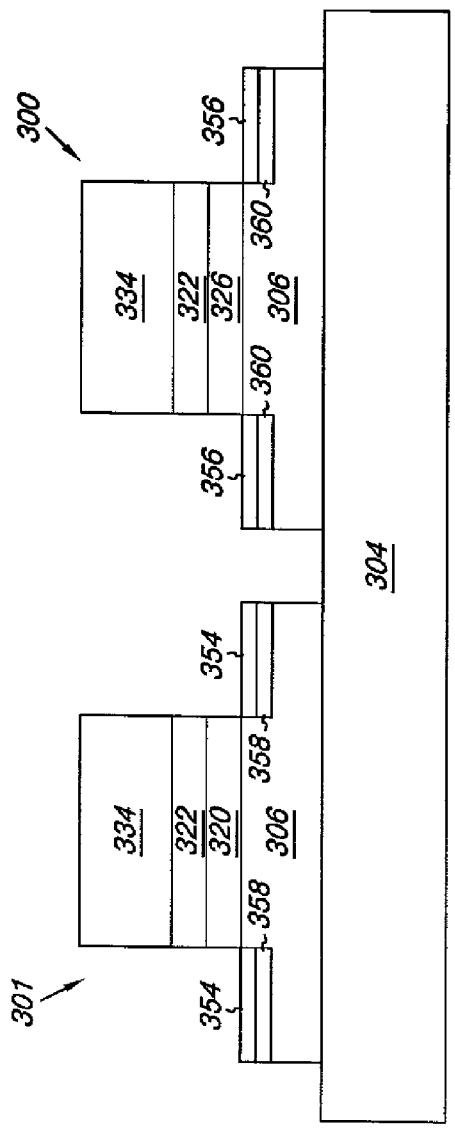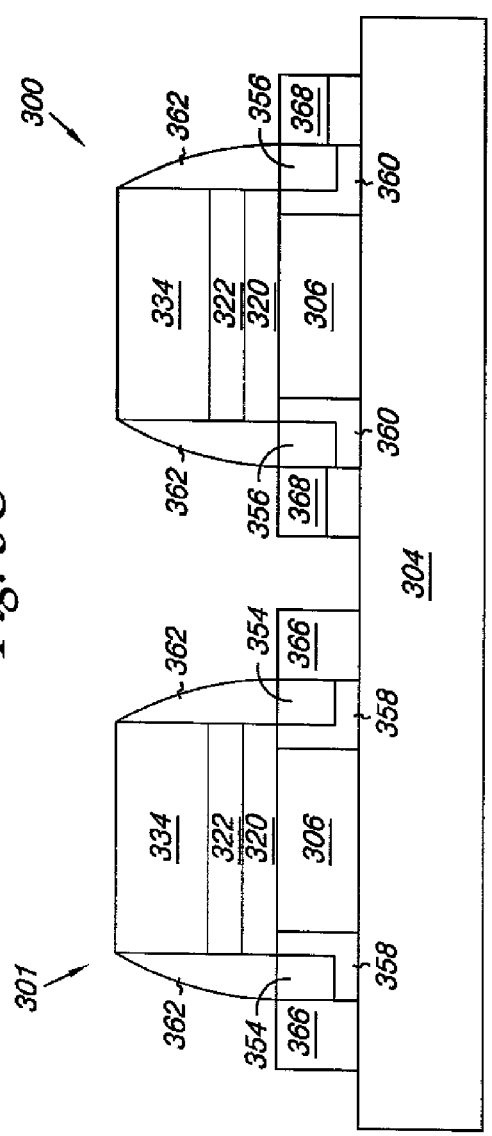

FIN FIELD EFFECT TRANSISTOR

This application is a Divisional of U.S. application Ser. No. 11/851,993, filed Sep. 7, 2007, the entire specification of which is herein incorporated by reference.

BACKGROUND

Fully depleted double gated FIN MOSFETs are an attractive choice for the 25 nanometer (nm) CMOS technology node, i.e. node design rule dimension of 25 nm and smaller, due to their good electrostatic characteristics, i.e., MOSFET device short channel effects, and very high on-current density. However, two issues arise from the use of FinFETs in the 25 nm and smaller design rule. First, the FIN thickness (t) must be smaller than 7 nm to realize improved device characteristics. Unfortunately, this results in a substantial reduction in the charge carriers mobility and device on-current due to device quantum effects, e.g., >50%. Second, if polysilicon is used as the gate material, which is the CMOS process preferred choice, the fully depleted Fin MOSFET (FinFET) device will have a low device threshold voltage (Vt) and very high off-current. This results from the polysilicon (poly-Si) gate work function and the full depletion operation mode of the Fin MOSFET.

BRIEF DESCRIPTION OF THE DRAWINGS

FIGS. 2A-2J illustrate an embodiment of a method of forming a FinFET with a poly silicon gate.

FIGS. 3A-3I illustrate an embodiment of a method of forming a FinFET with a metal gate.

DETAILED DESCRIPTION

Methods, devices, and systems for a FinFET are provided. One method embodiment includes forming a FinFET by forming a relaxed silicon germanium ($Si_{1-X}Ge_X$) body region for a fully depleted Fin field effect transistor (FinFET) having a body thickness of at least 10 nanometers (nm) for a process design rule of less than 25 nm. The method also includes forming a source and a drain on opposing ends of the body region, wherein the source and the drain are formed with halo ion implantation and forming a gate opposing the body region and separated therefrom by a gate dielectric.

Another method embodiment in the same design rule regime includes forming a substitute gate over the body region and forming a source and a drain on opposing ends of the body region, wherein the source and the drain are formed with halo ion implantation. This method further includes annealing the source and the drain before removing the substitute gate and forming a metal gate separated from the body region by a dielectric having a dielectric constant (K) of at least 12.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used in this disclosure, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

Figure 1:
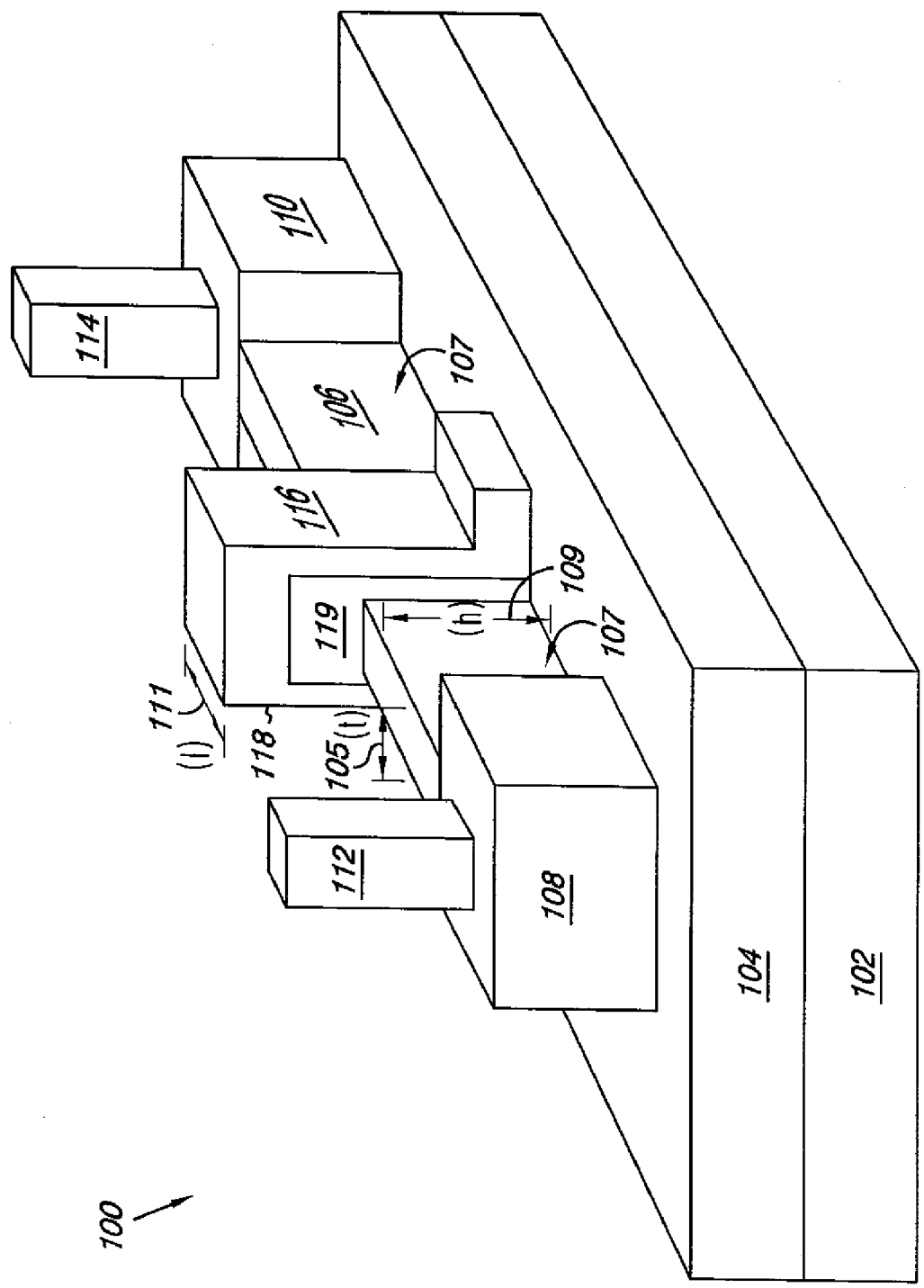
FIG. 1 illustrates an embodiment of a FinFET device.

FIG. 1 illustrates an embodiment of a fully depleted FinFET device 100 which can be formed according to one or more of the embodiments described herein, e.g., to a 25 nm or less process design rule where a thickness (t) 105 of the body region of the FinFET is at least 10 nm. As shown the embodiment of FIG. 1, the FinFET device 100 can be separated by an insulator layer 104, e.g., a base oxide (BOX), from a substrate 102, e.g. a bulk silicon wafer. As the reader will appreciate, the FinFET device 100 can be configured either as a p-type FinFET device or as an n-type FinFET device depending on choice of doping.

According to one or more embodiments the Fin 106 of the FinFET device 100 is formed of relaxed silicon germanium ($Si_{1-X}Ge_X$), where X is in the range of 0.5 to 0.6. In one or more embodiments, the vertical sidewalls 107 of the Fin 106 have height (h) of approximately 35 nm and serve as the channel region for current flow when the FinFET device 100 is "on". In one or more embodiments, the channel has a length (l) 111 which is approximately 25 nm or less in length according to the 25 nm design rule.

As shown in FIG. 1, the FinFET device, also includes a source 108 and a drain 110 structure (note that between 108 and 110 and the gate 116 source drain will extensions will exists as described later in FIGS. 2J and 3D) such that current will flow in the sidewalls 107 of the Fin 106 between the source 108 and the drain 110 when the FinFET device 100 is "on". As mentioned above, Fin 106 has a thickness (t) 105 of 10 nanometers (nm) or greater. When the Fin 106 is at a thickness of 10 nm or greater in a design rule regime of 25 nm or less, the significant drop in charge carrier mobility and device on-current associated with fins having a thickness of approximately 7 nm or less can be eliminated. However, maintaining the thickness (t) 105 of the Fin 106 to 10 nm or greater may result in worsening the short channel characteristics of the device. Thus, in one or more embodiments, this potentially detrimental impact on device short channel characteristics is eliminated by using halo-implantation with the source 108 and the drain 110.

As will be discussed in greater detail in connection with the embodiments shown in FIGS. 2 and 3, an appropriate halo-implantation can also resolve another FinFET issue related to a having a measurable device off-current when poly-silicon gates are used. That is, as will be described in more detail below, a dose used for the halo implantation and the associated resulting concentration can be appropriately adjusted to produce a particular FinFET device 100 threshold and provide a low off-current. The use of a halo-implantation may cause a drop in the charge carrier mobility and device on-current, e.g., by approximately 10%-20%, due to impurity scatter effects.

Thus, in one or more embodiments, the potential drop in charge carrier mobility and device on-current is resolved by straining at least the sidewalls 107 of the Fin 106 associated with the body region of the FinFET device 100 which serve as the channels for conduction underneath gate 116. In these one or more embodiments, the sidewalls 107 can be strained using a thin layer, e.g., a layer thickness of 15 nm or less, of silicon (Si) on an n-type device or Germanium (Ge) on a p-type device. That is, when the device is a p-type FinFET device 100, a thin layer of germanium (Ge) (shown in FIG. 2F) is deposited on the relaxed silicon germanium ($Si_{1-X}Ge_X$) body region, e.g., where X is approximately 0.5 to 0.6, and used to provide biaxial compressive strain to the sidewalls 107 of the Fin 106. When the device is an n-type FinFET device 100, a thin layer of silicon (Si) (shown in FIG. 2G) is deposited on the relaxed silicon germanium ($Si_{1-X}Ge_X$) body region and used to provide biaxial tensile strain to the sidewalls 107 of the Fin 106.

In operation, the current flow in the FinFET device is between the source 108 and the drain 110. As shown in FIG. 1, a source contact 112 is provided to the source 108 and a drain contact 114 is provided to the drain 110 such that a potential can be established between the source 108 and the drain 110. The embodiment of the FinFET device 100 in FIG. 1 also illustrates a gate 116 opposing the sidewalls 107 of the body region of the Fin 106 which serves as the channel. The gate 116 is separated from the body region of the Fin 106 which serves as the channel by a dielectric 119. In the fully depleted mode, the FinFET device 100 is normally "on", e.g., conducts a current between the source 108 and the drain 110 with 0.0 potential between to the gate 116 and the source 108.

Although a single gate 116 is shown opposing the sidewalls 107 of the body region of the Fin 106, one of ordinary skill in the art will appreciate that the gate 116 can be separated to form independently operable first and second gates for opposite sidewalls, e.g., a front and a back gate, of the FinFET device 100.

Figure 2A:
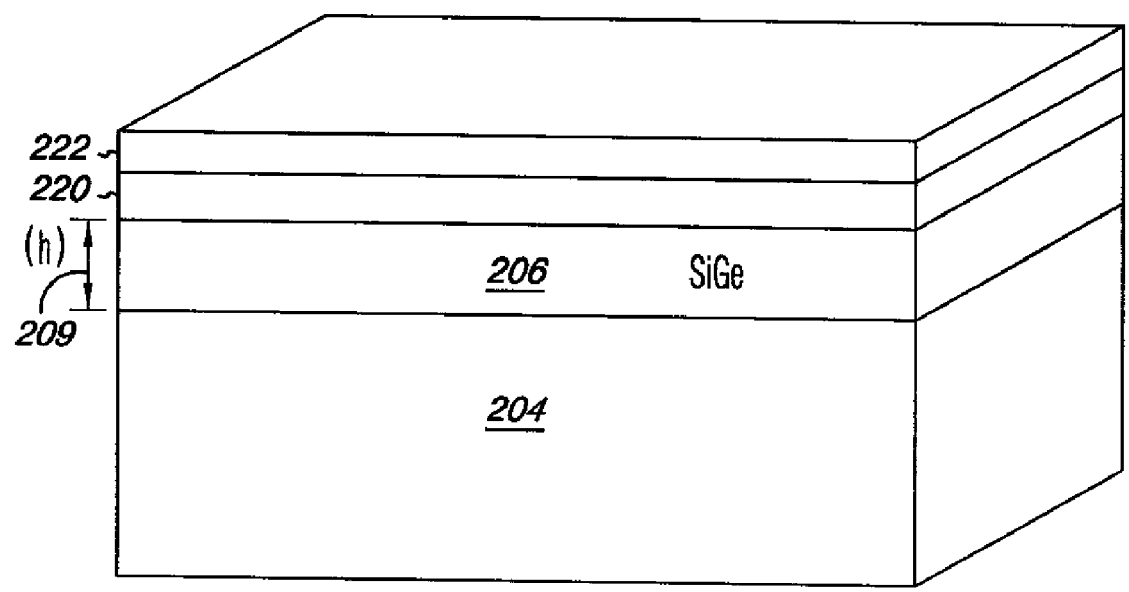

FIGS. 2A-2J illustrate an embodiment of a method of forming a FinFET with a poly silicon gate. FIG. 2A illustrates an embodiment of a method for forming a FinFET at a particular point in time in a fabrication process. As shown in the embodiment of FIG. 2A, a layer of silicon germanium ($Si_{1-X}Ge_X$) 206, where X is approximately 0.5 to 0.6, can be formed on an insulator layer 204, e.g., insulator layer 104 in FIG. 1. In one or more embodiments, the insulator layer 204 can be formed to a depth of approximately 145 nm. In one or more embodiments, the layer of silicon germanium ($Si_{1-X}Ge_X$) 206 can be formed over the insulator layer 204 to a height of approximately 35 nm in order to form a relaxed layer of silicon germanium ($Si_{1-X}Ge_X$) 206 on the insulator layer 204. As shown in the embodiment of FIG. 2A, a mask is then formed over the relaxed silicon germanium ($Si_{1-X}Ge_X$) layer 206. The mask can be formed of a thin layer of silicon dioxide ($SiO_2$) 220, e.g., formed to a depth of approximately 12 nm, and a thin layer of silicon nitride ($Si_3N_4$) 222, e.g., formed to a depth of approximately 12 nm. As will be described in more detail below, the relaxed silicon germanium ($Si_{1-X}Ge_X$) layer 206 will be used to form the Fin of the FinFET device, e.g., Fin 106 in device 100 FIG. 1.

As mentioned above, in one or more embodiments, the $Si_{1-X}Ge_X$ layer 206 can have an X value in a range of 0.5 to 0.6. In one or more embodiments, the silicon germanium layer 206 can be approximately 35 nm in depth, e.g., have a vertical height (h) of approximately 35 nm. This height (h) 209 to the layer 206 allows the silicon germanium layer 206 to be relaxed, as it has enough volume to relieve the silicon germanium layer 206 from strain caused by interactive forces in the silicon and germanium atomic structures. As mentioned above, one or more hard mask layers, e.g., 220 and 222, can be formed on the silicon germanium layer 206 using chemical vapor deposition (CVD), physical vapor deposition (PVD) or other suitable technique. In the example embodiment shown in FIG. 2A, the mask layers can include an oxide layer 220, which can be made of a silicon dioxide ($SiO_2$), and a nitride layer 222, which can be made of silicon nitride (i.e. $Si_3N_4$). The mask layers are used to define and protect the silicon germanium fin during the fin formation.

Figure 2B:
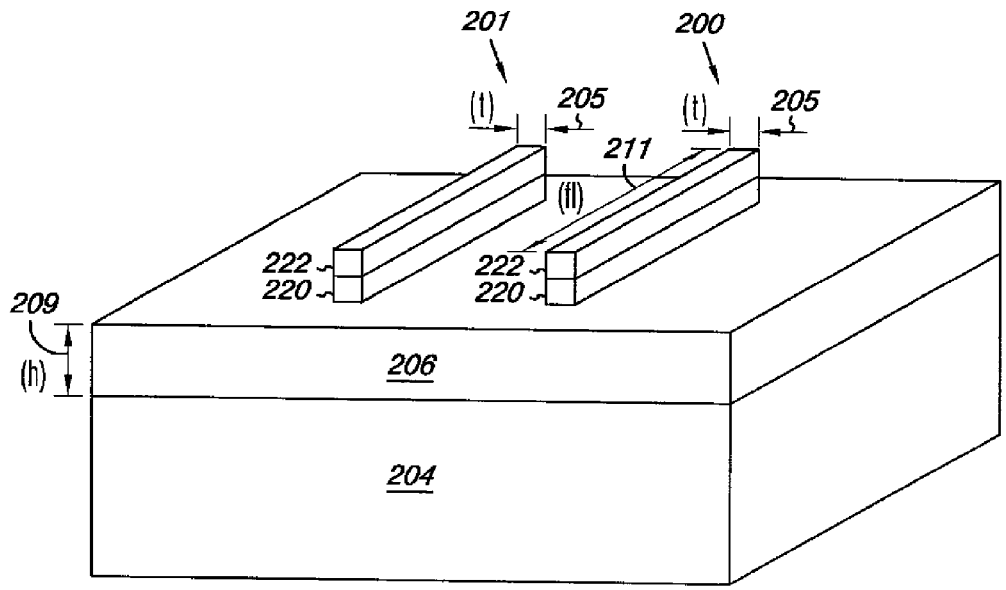

FIG. 2B illustrates an embodiment of a method for forming the FinFET from FIG. 2A at another particular point in a semiconductor fabrication sequence. As shown in FIG. 2B, the oxide and nitride mask layers, 220 and 222, have been patterned, e.g., using photolithographic techniques, and a portion of the oxide and nitride mask layers, 220 and 222, removed, leaving portions of the mask which will define the fins for the FinFET device. That is, as shown in FIG. 2B, a portion of the oxide and nitride mask layers, 220 and 222, have been removed, e.g., by reactive ion etching (RIE), to form a mask fin of oxide and nitride, 220 and 222, that will be used to define the silicon germanium fin locations, e.g., 200 and 201. As shown in FIG. 2B, a portion of the oxide and nitride mask layers, 220 and 222, are removed down to the relaxed layer of silicon germanium ($Si_{1-X}Ge_X$) 206. In one or more embodiments, this process step is used to determine the location and size, e.g., 200 and 201, of what will become the silicon germanium fins on the base oxide substrate 204. As shown in FIG. 2B, the photolithography masking and material removal is completed to leave two areas, 200 and 201, so as to form in one or more embodiments, a pair of complementary FinFET devices according to a CMOS process. In one or more embodiments, photolithography masking and material removal are used to remove a portion of the nitride layer 222 and silicon oxide layer 220, respectively, leaving a thickness (t) 205 to the masks that is approximately 10 nanometers thick and a length (l) 211 that is approximately 175 nanometers long. The dimensions of the masks serve in part to determine the characteristics and dimensions of the silicon germanium fin that will be formed into the FinFET device, e.g., FinFET device 100 shown in FIG. 1.

Figure 2C:
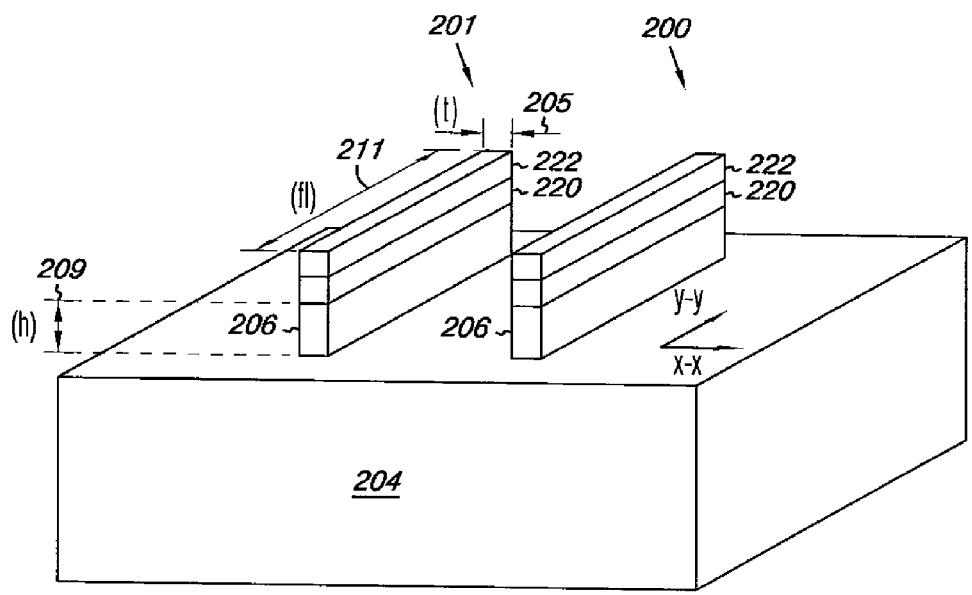

FIG. 2C illustrates an embodiment of a method for forming the FinFET from FIG. 2B at another particular point in a semiconductor fabrication sequence. FIG. 2C illustrates the formation of the silicon germanium Fins for a FinFET device. In FIG. 2C, the silicon germanium layer is removed, e.g., by RIE, to form the silicon germanium Fins 200 and 201 in the relaxed silicon germanium material 206. The relaxed silicon germanium material of the Fins 200 and 201 will be defined into a source region, drain region, and fully depleted body region, having sidewalls to the Fin structure which will serve as conduction channels for FinFET device. In one or more embodiments, the silicon germanium Fins 200 and 201 can be formed according to a 25 nm node process design rule. That is, in one or more embodiments, the silicon germanium Fins 200 and 201 can be approximately 175 nm or less in length (fl) 211 including the channel length, source/drain extensions, source/drain implants, and the contacts. As mentioned above, according to one or more embodiments, a thickness (t) 205 for the Fins is maintained at approximately 10 nm or greater. The silicon germanium layer can be approximately 35 nm in depth, e.g., have a height (h) 209 which is approximately 35 nm. As one of ordinary skill in the art will appreciate, forming the silicon germanium Fins 206 to a height of approximately 35 nm allows the silicon germanium Fins 206 to be sufficiently "relaxed", e.g., not under significant tensile or compressive strain due to interactive atomic forces. In FIG. 2C, two silicon germanium Fins 200 and 201 are illustrated which can be formed into an p-type (PMOS) and n-type (NMOS) fully depleted FinFET devices according to a CMOS process.

Embodiments, however, are not limited to forming just two structures or to forming pairs according to a CMOS process.

FIG. 2D illustrates the cross sectional view of the silicon germanium Fins 200 and 201 for FINFET devices from FIG. 2C. In FIG. 2D, the FinFET device consists of two silicon germanium Fins 200 and 201. As noted with FIG. 2C, the silicon germanium Fins 200 and 201 can be associated with forming two complimentary transistors for use as a CMOS device, one being a fully depleted p-type (PMOS) FinFET transistor and the other being an n-type (NMOS) FinFET transistor. Embodiments, however, are not limited to forming just two structures or to forming pairs according to a CMOS process.

FIG. 2E illustrates an embodiment of a method for forming the FinFET from FIG. 2D at another particular point in a semiconductor fabrication sequence. FIG. 2E illustrates the formation of a sacrificial oxide layer 236 on the sidewalls 207 of the FinFET devices 200 and 201. The structure associated with what will become the NMOS FinFET transistor, e.g., structure 201, is then photo lithographically masked with a photo resist layer 241. As discussed next in connection with FIG. 2F, the sacrificial oxide layer 236 on the structure associated with what will become the PMOS FinFET transistor, e.g., structure 200, is then exposed such that it can be removed in preparation for the formation of a germanium layer on the sidewalls 207 of what will become the PMOS FinFET to provide biaxial compressive strain on the silicon germanium (SiGe) Fin 206.

FIG. 2F illustrates an embodiment of a method for forming the FinFET from FIG. 2E at another particular point in a semiconductor fabrication sequence. As shown in FIG. 2F the sacrificial oxide layer 236 on the structure associated with what will become the PMOS FinFET transistor, e.g., structure 200, has been removed, e.g., using an HF acid wash, in preparation for the formation of a germanium (Ge) layer on the sidewalls 207. The germanium (Ge) layer 240 is epitaxially formed on the sidewalls 207 of what will become the PMOS FinFET, e.g., 200, to provide biaxial compressive strain on the silicon germanium (SiGe) Fin 206 in regions which will serve as conduction channels. In one or more embodiments, the germanium layer 240 can be approximately 12 nm thick.

The biaxial compressive strain is due to interactions of atomic forces at the interface of the relaxed silicon germanium Fin 206 and the layer of germanium 240 as the same will be understood by one of ordinary skill in the art. This compressive strain can improve the charge carrier mobility along the sidewalls 207 of the silicon germanium (SiGe) Fin 206 associated with a PMOS FinFET and also increase the device on-current. As shown in FIG. 2F, the photo resist layer 241 that was on the silicon germanium (SiGe) Fin 206 associated with what will become the NMOS FinFET transistor, e.g., structure 201, is removed in preparation for the formation of the silicon (Si) layer on the sidewalls 207 of what will become the NMOS FinFET 201 to provide biaxial tensile strain on the silicon germanium (SiGe) Fin 206.

FIG. 2G illustrates an embodiment of a method for forming the FinFET from FIG. 2F at another particular point in a semiconductor fabrication sequence. The silicon germanium (SiGe) Fin 206 associated with the PMOS FinFET can optionally be photo lithographically masked with photo resist to protect the germanium (Ge) layer 240 that was grown on the sidewalls 207 of the silicon germanium (SiGe) Fin 206, associated with what will become the PMOS FinFET transistor, e.g., structure 200, while the sacrificial oxide layer 236 on the structure associated with what will become the NMOS FinFET transistor, e.g., structure 201, is removed, e.g., using an HF acid wash, in preparation for the formation of a silicon (Si) layer on the sidewalls 207. A silicon (Si) layer 244 is then epitaxially grown on the sidewalls 207 of what will become the NMOS FinFET, e.g., 201, to provide biaxial tensile strain on the silicon germanium (SiGe) Fin 206 in regions which will serve as conduction channels. In one or more embodiments, the silicon (Si) layer 244 can be approximately 6 nm thick.

The biaxial tensile strain is due to interactions of atomic forces at the interface of the relaxed silicon germanium (SiGe) Fin 206 and the layer of silicon (Si) 244 as the same will be understood by one of ordinary skill in the art. This tensile strain can improve the charge carrier mobility in what will be the conduction channels along the sidewalls 207 of the silicon germanium (SiGe) Fin 206 associated with a NMOS FinFET and also increase the device on-current. As shown in the embodiment of FIG. 2G, the silicon (Si) layer 244 that is epitaxially grown on the sidewalls 207 of what will become the NMOS FinFET, e.g., 201, may also be grown on the sidewalls 207 of the silicon germanium (SiGe) Fin 206 of what will become the PMOS FinFET, e.g., structure 200.

FIG. 2H illustrates an embodiment of a method for forming the FinFET from FIG. 2G at another particular point in a semiconductor fabrication sequence. FIG. 2H, illustrates the formation of the gate and the gate dielectric in the PMOS and NMOS FinFET structures, e.g., 200 and 201 respectively. To form the gate dielectric 246, the nitride hard mask layer 222 is removed from the Fins of the PMOS and NMOS FinFET structures, e.g., 200 and 201. In FIG. 2H, a gate dielectric 246, e.g., $SiO_2$, can be thermally grown on the layer of silicon (Si) 244 that was formed on the sidewalls 207 of the NMOS FinFET 201 and the layer of germanium (Ge) 240 and the layer of silicon (Si) 244 on the sidewalls 207 of the PMOS FinFET 200. The structures can then be patterned and masked to form gates 250 over the gate dielectric layer 246. In one or more embodiments, the gate is formed of polysilicon, e.g., through CVD, PVD, or other suitable technique. As shown in the embodiment of FIG. 2H, the gate 250 is formed so that it straddles the sidewalls 207 of the body regions which will serve as the conduction channels for the PMOS and NMOS FinFET devices.

FIG. 2I illustrates an embodiment of a method for forming the FinFET from FIG. 2H at another particular point in a semiconductor fabrication sequence. In FIG. 2I the drawing shown in FIG. 2H has been rotated to illustrates a cross sectional view of both a PMOS FinFET device, e.g., 200, and an NMOS FinFET device, e.g., 201. FIG. 2I thus enables illustration of one or more embodiments in which source/drain extensions (SDEs), e.g., 254 for the NMOS FinFET structure 201 and 256 for the PMOS FinFET structure 200, may be formed at opposite ends of the gates 250. To form the SDEs 254 and 256, the nitride hard mask layer 222 and the oxide hard mask layer 220 are removed to expose a source region and a drain region to the silicon germanium (SiGe) Fins 206. The SDEs 254 and 256 may be formed by lightly doping an area below the surface of the exposed source and drain regions of the silicon germanium (SiGe) Fins 206. In one or more embodiments, the SDE implantation for the NMOS FinFET 201 structure can include doping SDE regions 254 with an n-type dopant such as arsenic (As) or phosphorous (P) using an ion implantation at a dose of approximately $5 \times 10^{14}$ atoms/cm$^2$ to form an n-type doping concentration of approximately $2 \times 10^{19}$ atoms/cm$^3$ to a depth of approximately 25 nm. The SDE implantation for the PMOS FinFET structure 200 can include doping SDE 256 with a p-type dopant such as boron (B) using an ion implantation at a dose of approximately $5 \times 10^{14}$ atoms/cm$^2$ to form an p-type doping concentration of approximately $2\times10^{19}$ atoms/cm$^3$ to a depth of approximately 25 nm.

In one or more embodiments, a halo implantation can then be performed to create halo regions, e.g., 258 for the NMOS FinFET structure 201 and 260 for the PMOS FinFET structure, surrounding the SDEs 254 and 256 to the silicon germanium (SiGe) Fins 206. In one or more embodiments, the halo implantation for the NMOS FinFET structure 201 can include doping halo regions 258 with a p-type dopant such as boron (B) using an ion implantation at a dose of approximately $5\times10^{13}$ atoms/cm$^2$ to form an p-type doping concentration of approximately $2\times10^{18}$ atoms/cm$^3$ to a depth of approximately 35 nm. In one or more embodiments, the halo implantation for the PMOS FinFET structure 200 can include doping halo regions 260 with an n-type dopant such as arsenic (As) or phosphorous (P) using an ion implantation at a dose of approximately $5\times10^{13}$ atoms/cm$^2$ to form an n-type doping concentration of approximately $2\times10^{18}$ atoms/cm$^3$ to a depth of approximately 35 nm.

Figure 2J:
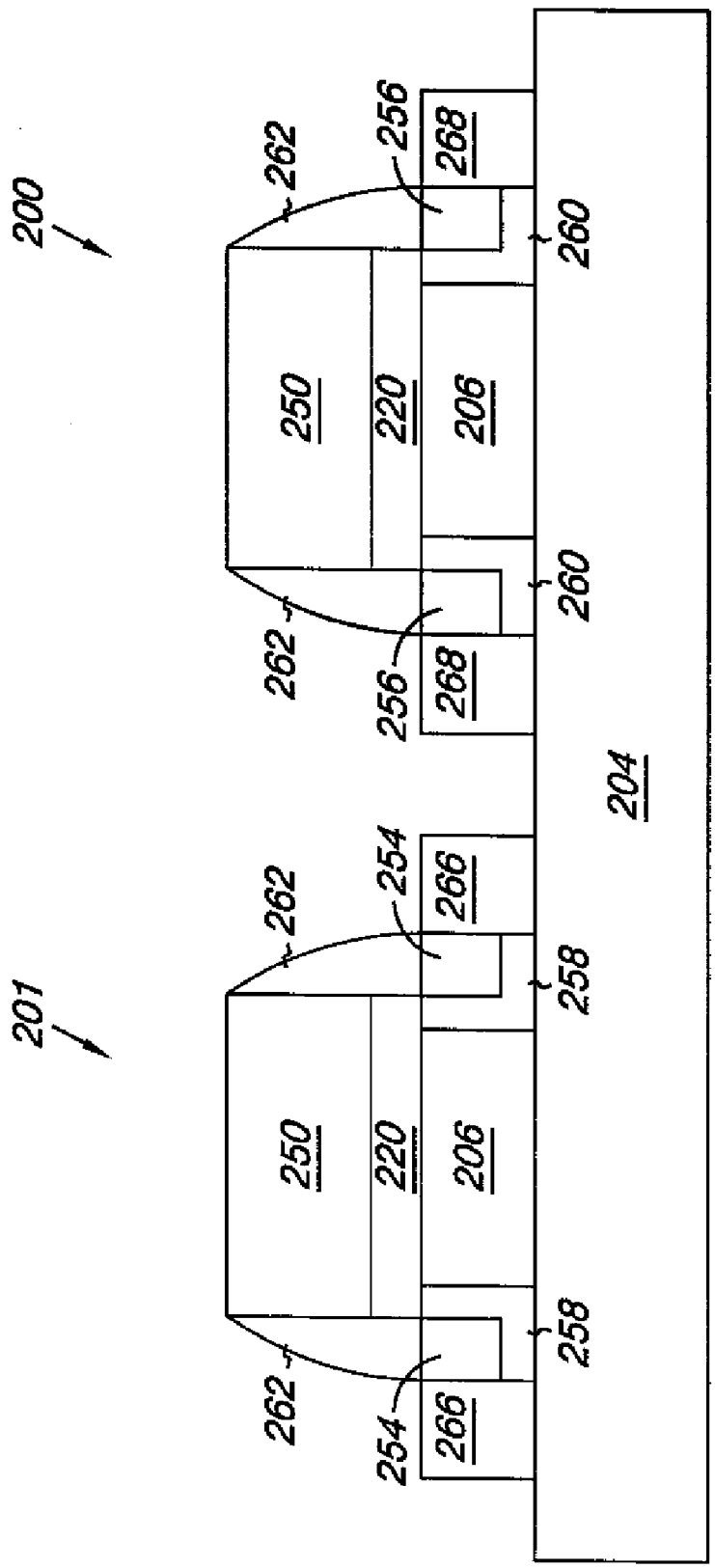

FIG. 2J illustrates an embodiment of a method for forming the FinFET from FIG. 2I at another particular point in a semiconductor fabrication sequence. FIG. 2J illustrates a cross sectional view of the FinFET device, as shown in FIG. 2I, along the length of the device to illustrate completion of the source and drain regions, e.g., 266 for the NMOS FinFET structure 201 and 268 for the PMOS FinFET structure 200. As shown in FIG. 2J, a nitride spacer 262 is formed along the sides of the gates 250 and on a portion of a top surface of the SDEs 254 and 256. As the reader will appreciate, the nitride spacers 262 can be formed using a conformal deposition of nitride followed by an ion etch to remove the nitride from a top surface of the gates 250 and to expose a portion of a top surface of the SDEs spaced further from the gates 250 by the nitride spacer. More heavily doped source/drain (S/D) regions can then be formed, e.g., S/D regions 266 for NMOS FinFET structure 201 and S/D regions 268 for the PMOS FinFET structure 200.

In one or more embodiments, the S/D region 268 implant for the PMOS FinFET can include doping S/D regions 268 with a p-type dopant such as boron (B) using an ion implantation at a dose of approximately $5\times10^{15}$ atoms/Cm$^2$ to form a p-type doping concentration of approximately $2\times10^{20}$ atoms/cm$^3$ to a depth of approximately 35 nm. The S/D region 266 implant for the NMOS FinFET can include doping S/D regions 266 with an n-type dopant such as arsenic (As) or phosphorous (P) using an ion implantation at a dose of approximately $5\times10^{15}$ atoms/cm$^2$ to form an n-type doping concentration of approximately $2\times10^{20}$ atoms/cm$^3$ to a depth of approximately 35 nm. Once the S/D regions 266 and 268 are implanted, the S/D regions 266 and 268 are annealed to drive in and activate the S/D regions 266 and 268. In one or more embodiments, the S/D regions 266 and 268 can be annealed at a temperature in the range of 850 degrees)(°) Celsius (C) to 1050° C. for approximately 5 seconds. After the S/D regions 266 and 268 are formed, the FinFET structure can be completed using back end of the line (BEOL) CMOS processing techniques.

Figure 3A:
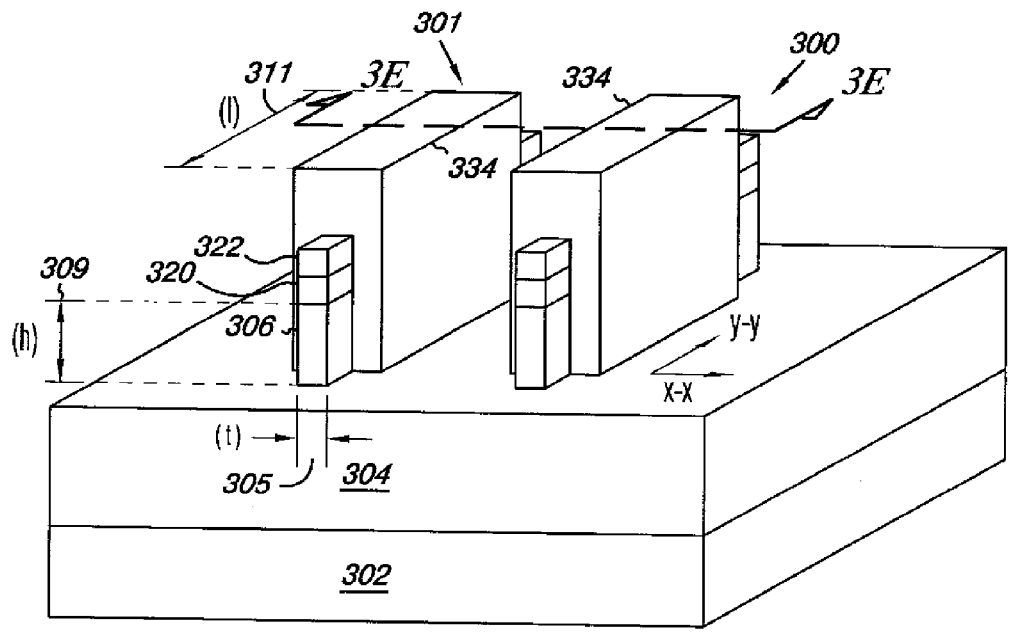

FIGS. 3A-3J illustrate an embodiment of a method of forming a FinFET with a gate dielectric material having a high dielectric constant (K), e.g., a K at least as great as 12, and a metal gate according to the present invention. FIG. 3A illustrates an embodiment of a method for forming the FinFET at a particular point in a semiconductor fabrication sequence commencing from the structure shown in FIGS. 2C and 2D. That is, FIG. 3A illustrates silicon germanium Fins 300 and 301 formed according to a 25 nm process design rule.

That is, in one or more embodiments, the silicon germanium Fins 300 and 301 have been formed to approximately 175 nm in length according to a 25 nm node design rule to provide a channel length (l) 311 of 25 nm or less. As mentioned above, according to one or more embodiments, a thickness (t) 305 for the Fins is maintained at approximately 10 nm or greater. The silicon germanium Fins 306 can have a height (h) 309 which is approximately 35 nm. As one of ordinary skill in the art will appreciate, forming the silicon germanium. Fins 306 to a height of approximately 35 nm allows the silicon germanium Fins 306 to be sufficiently "relaxed", e.g., not under significant tensile or compressive strain due to interactive atomic forces. In FIG. 3A, two silicon germanium Fins 300 and 301 are illustrated which can be formed into an p-type (PMOS) and n-type (NMOS) fully depleted FinFET devices according to a CMOS process. Embodiments, however, are not limited to forming just two structures or to forming pairs according to a CMOS process.

As shown in the embodiment of FIG. 3A, sacrificial gates 334 are formed over the FinFET structures from FIGS. 2C and 2D. In one or more embodiments the sacrificial gates 334 can be formed by depositing a thick polysilicon layer 334, e.g., 150 nm thick, over the NMOS FinFET 301 and the PMOS FinFET 300 structures. The poly-silicon layer 334 can be patterned and removed by photolithography techniques, as the same are known and understood by one of ordinary skill in the art. The removal technique leaves a sacrificial gates 334 over the NMOS and the PMOS FinFET structures, e.g., 301 and 300 respectively, while leaving a portion of the NMOS and the PMOS FinFET structures, e.g., 301 and 300 respectively, exposed that will be the source and the drain regions for the devices.

Figure 3B:
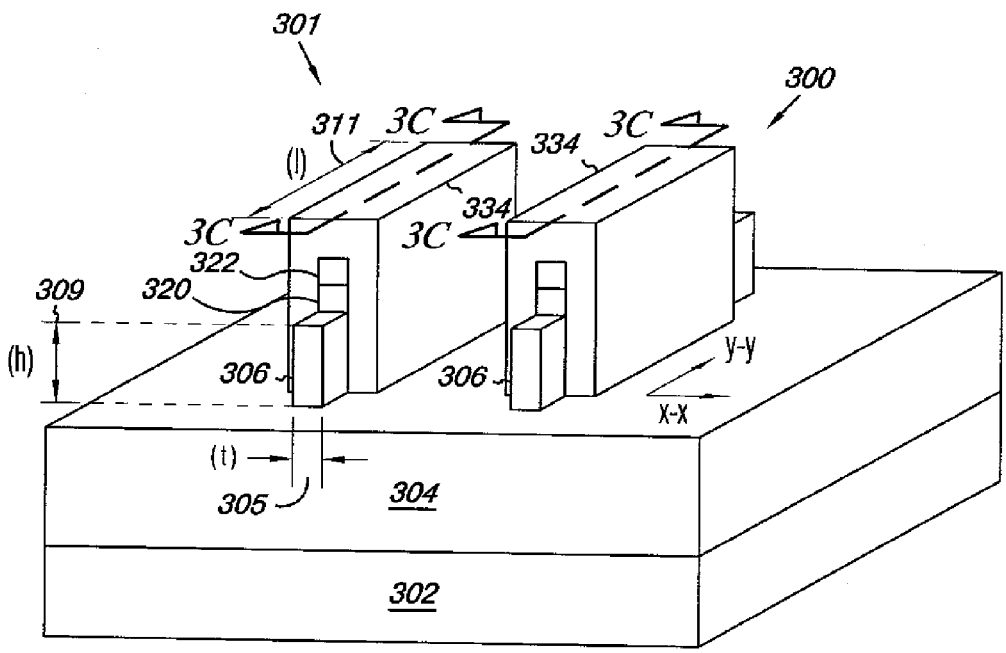

FIG. 3B illustrates an embodiment of a method for forming the FinFET from FIG. 3A at another particular point in a semiconductor fabrication sequence. FIG. 3B is an illustration, according to one or more embodiments, for forming source/drain (S/D) regions at opposite ends of the sacrificial gates 334. As shown in FIG. 3B, to form the S/D regions the nitride hard mask layer 322 and the oxide hard mask layer 320 are removed, e.g., according to a selective RIE process, to expose a source region and a drain region of the silicon germanium (SiGe) Fins 306 that is not covered by the sacrificial gates 334. As one of ordinary skill in the art will appreciate, the use of the sacrificial gates 334, e.g., formed from polysilicon and used to act as a gate structure while the source/regions are formed, can facilitate a fabrication sequence in which high temperature anneals are performed first before high dielectric constant (K) dielectric materials, e.g., K value of at least 12, and metal gates are formed.

FIG. 3C illustrates an embodiment of a method for forming the FinFET from FIG. 3B at another particular point in a semiconductor fabrication sequence. FIG. 3C illustrates the drawing shown in FIG. 3B has been rotated to illustrates a cross sectional view, along the cat lines 3C-3C in FIG. 3B, of both a PMOS FinFET device, e.g., 300, and an NMOS FinFET device, e.g., 301. FIG. 3C thus enables source/drain extensions (SDEs), e.g., 354 for the NMOS FinFET structure 301 and 356 for the PMOS FinFET structure 300, as shown at opposite ends of the sacrificial gates 334. As shown in FIG. 3B, to form the SDEs 354 and 356 the nitride hard mask layer 322 and the oxide hard mask layer 320 have been removed to expose S/D regions to the silicon germanium (SiGe) Fins 306. In one or more embodiments, the SDEs 354 and 356 may be formed by lightly doping an area below the surface of the exposed S/D regions of the silicon germanium (SiGe) Fins 206. In one or more embodiments, the SDE implantation for the NMOS FinFET 301 structure can include doping SDE regions 354 with an n-type dopant such as arsenic (As) or phosphorous (P) using an ion implantation and annealing at a dose of approximately $5 \times 10^{14}$ atoms/cm$^2$ to form an n-type doping concentration of approximately $2 \times 10^{19}$ atoms/cm$^3$ to a depth of approximately 25 nm. The SDE implantation for the PMOS FinFET structure 300 can include doping SDE 356 with a p-type dopant such as boron (B) using an ion implantation at a dose of approximately $5 \times 10^{14}$ atoms/cm$^2$ to form an p-type doping concentration of approximately $2 \times 10^{19}$ atoms/cm$^3$ to a depth of approximately 25 nm.

In one or more embodiments, a halo implantation can then be performed to create halo regions, e.g., 358 for the NMOS FinFET structure 301 and 360 for the PMOS FinFET structure, surrounding the source and drain regions of the silicon germanium (SiGe) Fins 306. In one or more embodiments, the halo implantation for the NMOS FinFET structure 301 can include doping halo regions 358 with a p-type dopant such as boron (B) using an ion implantation at a dose of approximately $5 \times 10^{13}$ atoms/cm$^2$ to form an p-type doping concentration of approximately $2 \times 10^{18}$ atoms/cm$^3$ to a depth of approximately 35 nm. In one or more embodiments, the halo implantation for the PMOS FinFET structure 300 can include doping halo regions 360 with an n-type dopant such as arsenic (As) or phosphorous (P) using an ion implantation at a dose of approximately $5 \times 10^{13}$ atoms/cm$^2$ to form an n-type doping concentration of approximately $2 \times 10^{18}$ atoms/cm$^3$ to a depth of approximately 35 nm.

FIG. 3D illustrates an embodiment of a method for forming the FinFET from FIG. 3C at another particular point in a semiconductor fabrication sequence. FIG. 3D illustrates a cross sectional view of the FinFET device, as shown in FIG. 3C, along the length of the device to illustrate completion of the source and drain regions, e.g., 366 for the NMOS FinFET structure 301 and 368 for the PMOS FinFET structure 300. As shown in FIG. 3D, a nitride spacer 362 is formed along the sides of the sacrificial gates 334 and on a portion of a top surface of the SDEs 354 and 356. As the reader will appreciate, the nitride spacers 362 can be formed using a conformal deposition of nitride followed by an ion etch to remove the nitride from a top surface of the sacrificial gates 334 and to expose a portion of a top surface of the SDEs spaced further from the sacrificial gates 334 by the nitride spacer. More heavily doped source/drain (S/D) regions can then be formed, e.g., S/D regions 366 for NMOS FinFET structure 301 and S/D regions 368 for the PMOS FinFET structure 300.

In one or more embodiments, the S/D region 368 implant for the PMOS FinFET can include doping S/D regions 368 with a p-type dopant such as boron (B) using an ion implantation at a dose of approximately $5 \times 10^{15}$ atoms/cm$^2$ to form a p-type doping concentration of approximately $2 \times 10^{20}$ atoms/cm$^3$ to a depth of approximately 35 nm. The S/D region 366 implant for the NMOS FinFET can include doping S/D regions 366 with an n-type dopant such as arsenic (As) or phosphorous (P) using an ion implantation at a dose of approximately $5 \times 10^{15}$ atoms/cm$^2$ to form an n-type doping concentration of approximately $2 \times 10^{20}$ atoms/cm$^3$ to a depth of approximately 35 nm. Once the S/D regions 366 and 368 are implanted, the S/D regions 366 and 368 are annealed to drive in and activate the S/D regions 366 and 368. In one or more embodiments, the S/D regions 366 and 368 can be annealed at a temperature in the range of 850° C. to 1050° C. for approximately 5 seconds. Embodiments, however, are not so limited to this example.

Figure 3E:
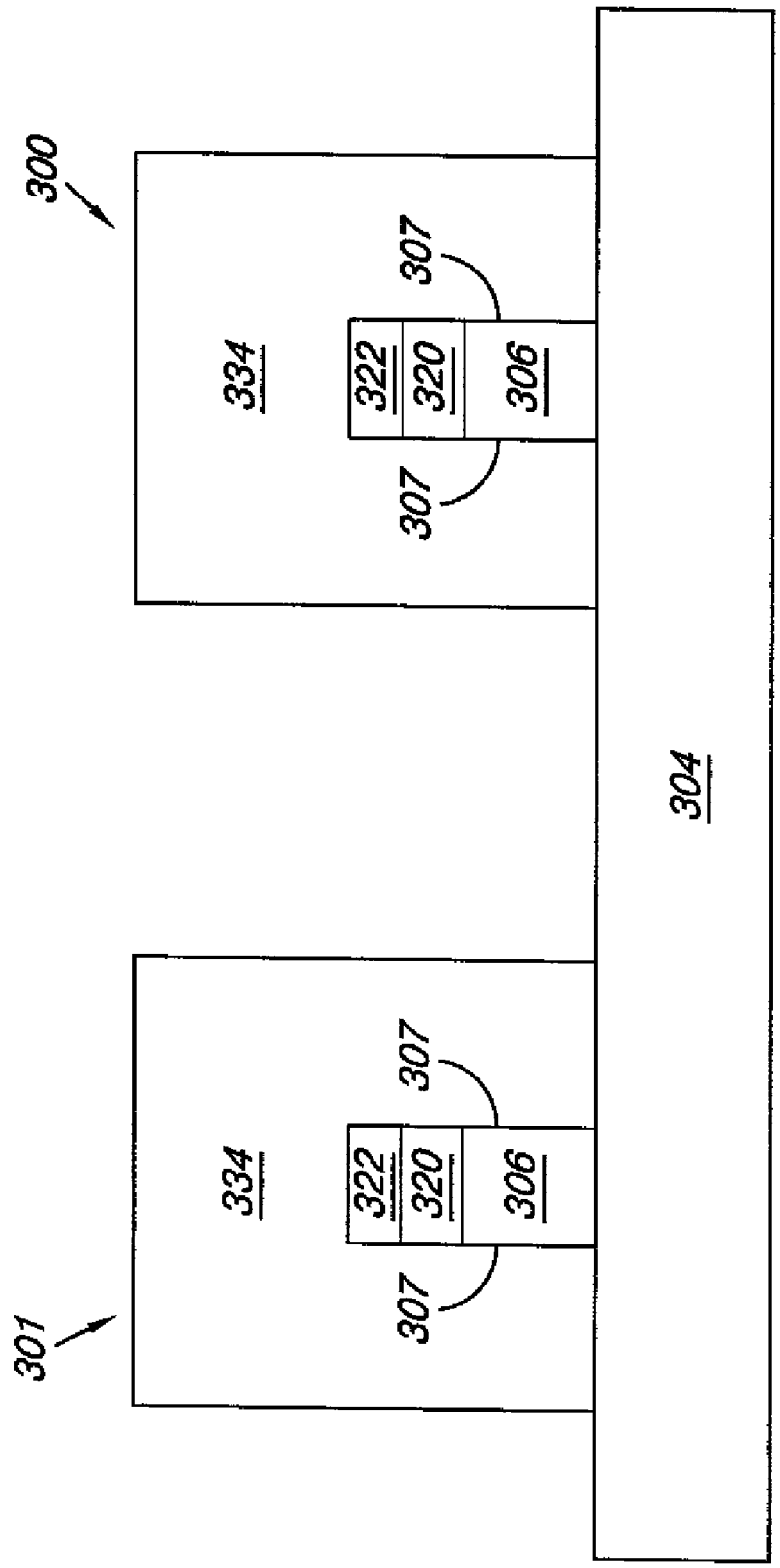

FIG. 3E illustrates a cross sectional view of the embodiment of a method for forming the FinFET from FIG. 3D taken along cut line 3E-3E in FIG. 3A. That is, FIG. 3E illustrates the sacrificial gates 334, e.g., formed from polysilicon and used to act as a gate structure while the SDE 354 and 356, halo 358 and 360, and S/D 366 and 368 region implantation and annealing process steps are being performed. The sacrificial gates 334 are needed so that the high temperature processes, e.g., of approximately 1000° C., can be performed while the sacrificial gates 334 are present rather than actual metal gates or high dielectric constant (K) dielectric materials, e.g., K's of at least 12. That is, as one of ordinary skill in the art will appreciate, metal gates and high dielectric constant (K) dielectric materials cannot withstand the high temperatures of the annealing processes necessary to drive in and activate the dopants of the S/D regions.

Figure 3F:
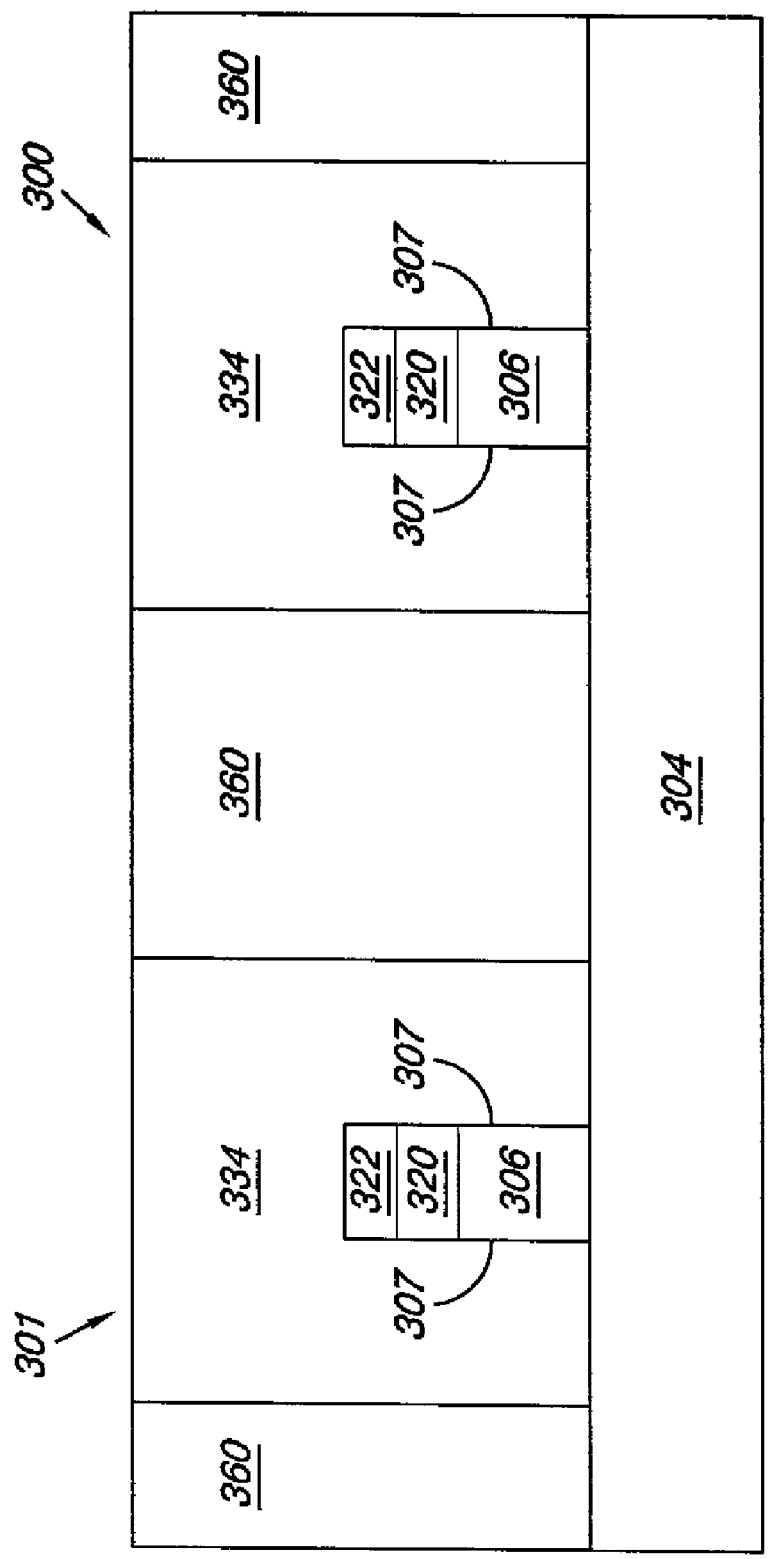

FIG. 3F illustrates an embodiment of a method for forming the FinFET from FIG. 3E at another particular point in a semiconductor fabrication sequence. As shown in the embodiment of FIG. 3F a hard mask 360, e.g., tetra-ethyl-ortho-silicate (TEOS) is deposited over the structures, e.g., 300 and 310 to fill in the space on the substrate, e.g., insulator layer 304, between the PMOS FinFET structure 300 and the NMOS FinFET structure 301. Hard mask 360 can be deposited using CVD, PVD, or other suitable technique. The hard mask 360 can be planarized to a level even with the sacrificial gates 334, e.g., using CMP or other suitable technique.

Figure 3G:
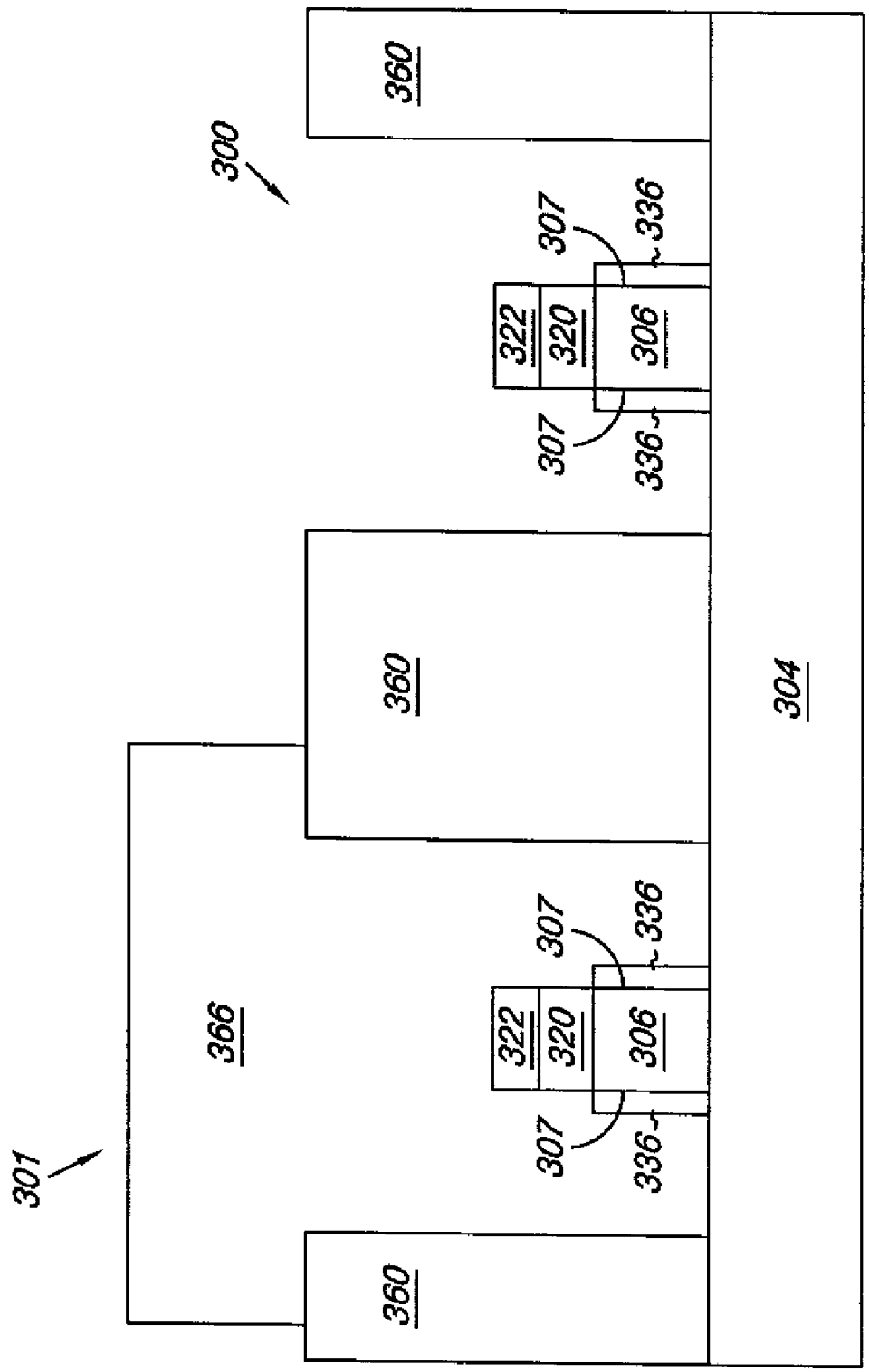

FIG. 3G illustrates an embodiment of a method for forming the FinFET from FIG. 3F at another particular point in a semiconductor fabrication sequence. As shown in FIG. 3G, the sacrificial gate 334 is removed from both the NMOS FinFET structure 301 and the PMOS FinFET structure 300. As shown in FIG. 3G, a sacrificial oxide layer 336 can be formed on the sidewalls 307 of both the NMOS FinFET structure 301 and the PMOS FinFET structure 300. The NMOS FinFET structure 301 can then be photo lithographically masked with a photo resist layer 366. The sacrificial oxide layer 336 on the PMOS FinFET structure 300 is then removed in preparation for the formation of a germanium (Ge) layer to strain the silicon germanium (SiGe) Fin 306, e.g., body region. As discussed next in connection with FIG. 3H, the sacrificial oxide layer 336 on the structure associated with what will become the PMOS FinFET transistor, e.g., structure 300, is then exposed such that it can be removed in preparation for the formation of a germanium (Ge) layer 340 on the sidewalls 307 of what will become the PMOS FinFET to provide biaxial compressive strain on the silicon germanium (SiGe) Fin 306.

Figure 3H:
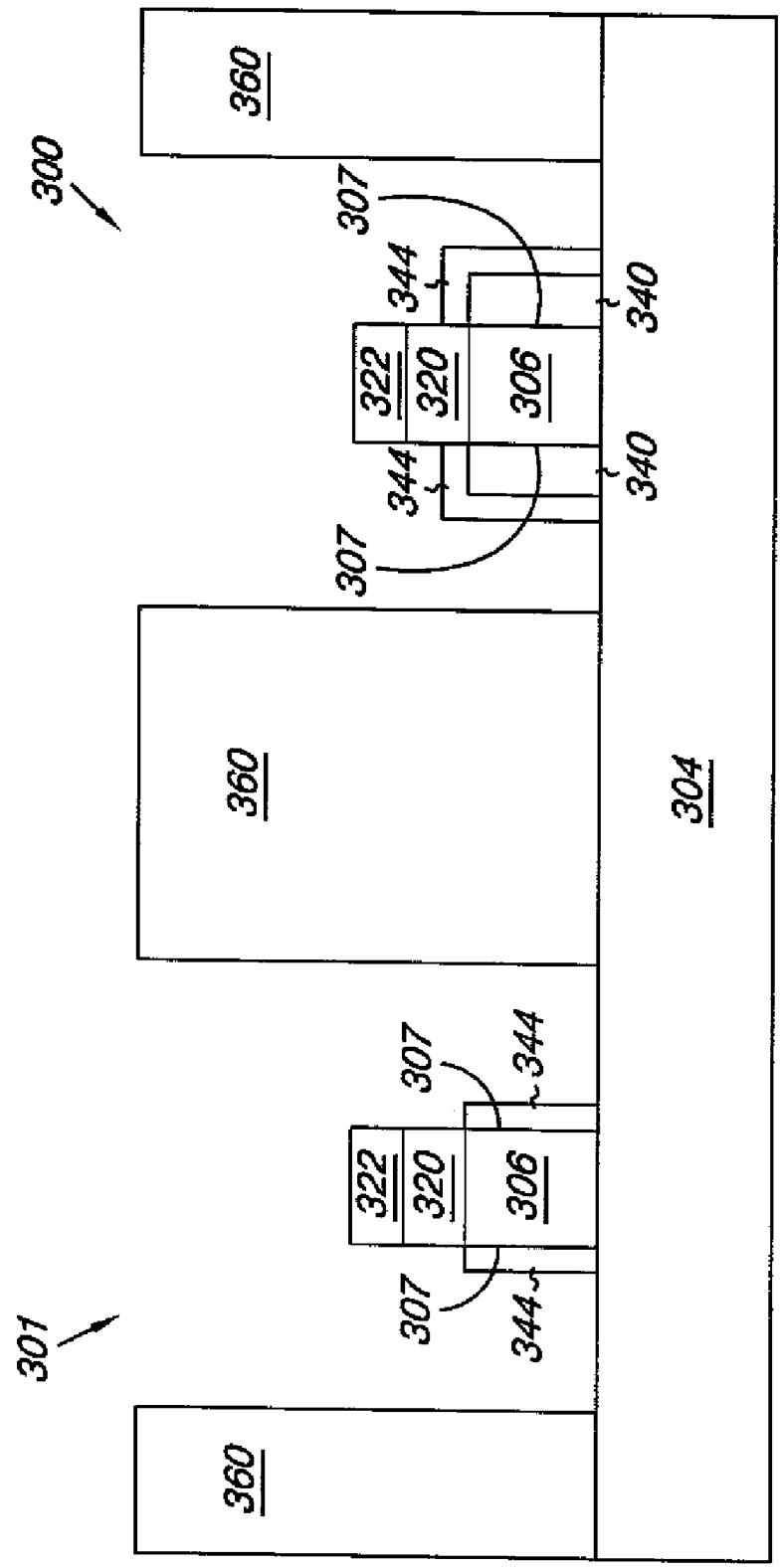

FIG. 3H illustrates an embodiment of a method for forming the FinFET from FIG. 3G at another particular point in a semiconductor fabrication sequence. As shown in FIG. 3H, the sacrificial oxide layer 336 on the structure associated with what will become the PMOS FinFET transistor, e.g., structure 300, has been removed, e.g., using an HF acid wash, in preparation for the formation of a germanium (Ge) layer on the sidewalls 307. The germanium (Ge) layer 340 is epitaxially formed on the sidewalls 307 of what will become the PMOS FinFET, e.g., 300, to provide biaxial compressive strain on the silicon germanium (SiGe) Fin 306 in regions which will serve as conduction channels. In one or more embodiments, the germanium (Ge) layer 340 can be approximately 12 nm thick.

The biaxial compressive strain is due to interactions of atomic forces at the interface of the relaxed silicon germanium Fin 306 and the layer of germanium (Ge) 340 as the same will be understood by one of ordinary skill in the art. This compressive strain can improve the charge carrier mobility along the sidewalls 307 of the silicon germanium (SiGe) Fin 306 associated with a PMOS FinFET and also increase the device on-current.

As shown in FIG. 3H, the photo resist layer 366 that was on the silicon germanium (SiGe) Fin 306 associated with what will become the NMOS FinFET transistor, e.g., structure 301, is removed. The silicon germanium (SiGe) Fin 306 associated with the PMOS FinFET 300 can optionally be photo lithographically masked with photo resist to protect the germanium (Ge) layer 340 that was grown on the sidewalls 307 of the silicon germanium (SiGe) Fin 306, associated with what will become the PMOS FinFET transistor, e.g., structure 300, while the sacrificial oxide layer 336 on the structure associated with what will become the NMOS FinFET transistor, e.g., structure 301, is removed, e.g., using an HF acid wash, in preparation for the formation of a silicon (Si) layer on the sidewalls 307. A silicon (Si) layer 344 is then epitaxially grown on the sidewalls 307 of what will become the NMOS FinFET, e.g., 301, to provide biaxial tensile strain on the silicon germanium (SiGe) Fin 306 in regions which will serve as conduction channels. In one or more embodiments, the silicon (Si) layer 344 can be approximately 6 nm thick.

The biaxial tensile strain is due to interactions of atomic forces at the interface of the relaxed silicon germanium (SiGe) Fin 306 and the layer of silicon (Si) 344 as the same will be understood by one of ordinary skill in the art. This tensile strain can improve the charge carrier mobility in what will be the conduction channels along the sidewalls 307 of the silicon germanium (SiGe) Fin 306 associated with a NMOS FinFET and also increase the device on-current. As shown in the embodiment of FIG. 3H, the silicon (Si) layer 344 that is epitaxially grown on the sidewalls 307 of what will become the NMOS FinFET, e.g., 301, may also be epitaxially grown on the sidewalls 307 of the silicon germanium (SiGe) Fin 306 of what will become the PMOS FinFET, e.g., structure 300 over the germanium (Ge) layer 340.

Figure 3I:
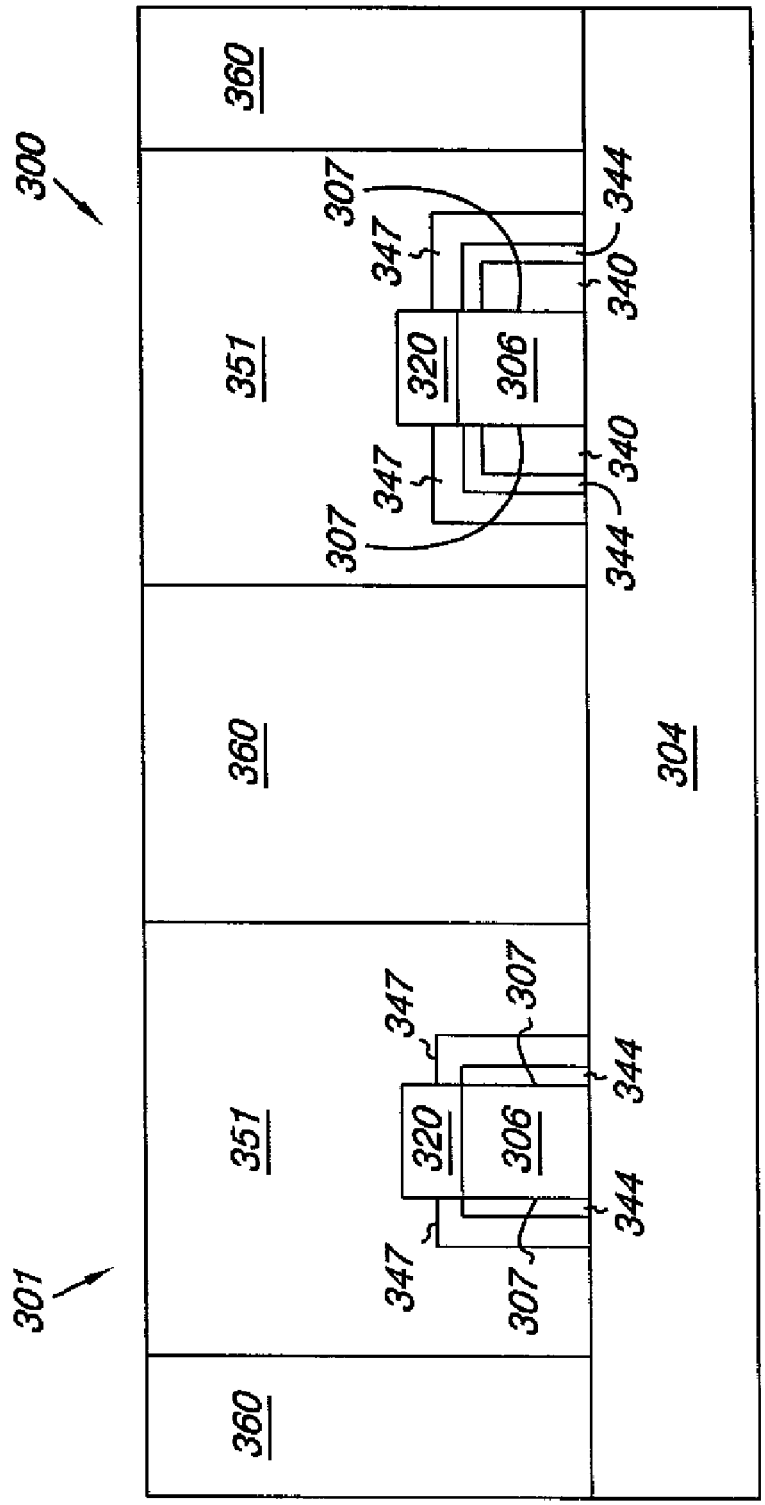

FIG. 3I illustrates an embodiment of a method for forming the FinFET from FIG. 3H at another particular point in a semiconductor fabrication sequence. FIG. 3I, illustrates the formation of a high dielectric constant (K) gate dielectric material and a metal gate for the FinFET structures, e.g. 300 and 301. In FIG. 3I, the high K gate dielectric 347 can be formed using a plasma vapor deposition (PVD) or other suitable technique. To form the high K gate dielectric 347, the nitride hard mask layer 322 is removed from the silicon germanium (SiGe) Fins 306 of the PMOS and NMOS FinFET structures, e.g., 300 and 301. In FIG. 3I, the high K dielectric 347 is formed on the layer of silicon (Si) 344 associated with the sidewalls 307 of the NMOS FinFET 301 and the layer of silicon (Si) 344 and the layer of germanium (Ge) 340 associated with the sidewalls 307 of the PMOS FinFET 300. A metal gate structure 351, e.g., aluminum (Al), copper (Cu), tungsten (W) or other suitable metal gate structure, can then be formed over the high K gate dielectric material 347. In one or more embodiments, the metal gate structure 351 is formed using CVD, PVD, or other suitable technique. As shown in the embodiment of FIG. 3I, the metal gate structure 351 is formed so that it straddles the sidewalls 307 of the body regions which will serve as the conduction channels for the PMOS and NMOS FinFET devices, e.g., 300 and 301. As one or ordinary skill in the art will appreciate, the metal gate structure 351 can be planarized to the top surface of the hard mask 360, e.g., TEOS material. The process described in the embodiment of FIGS. 3A-3I can then be completed using back end of the line (BEOL) processing techniques.

Figure 4:
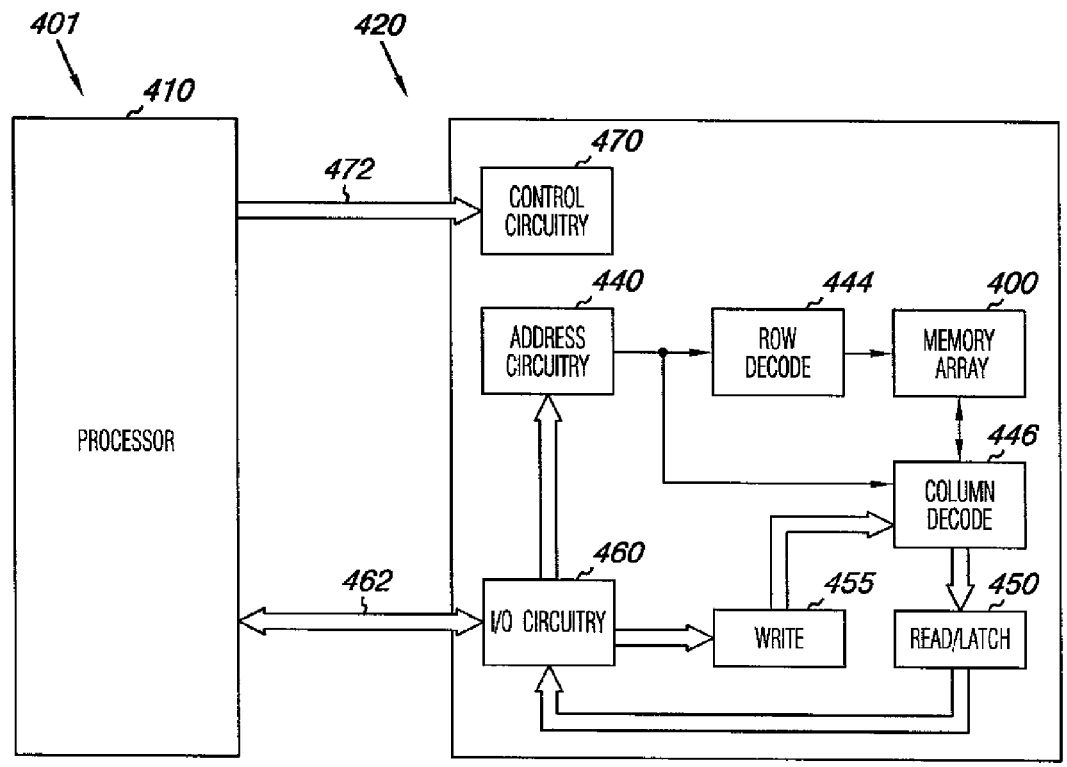
FIG. 4 is a functional block diagram of an electronic memory system having at least one memory device in accordance with an embodiment of the present disclosure.

FIG. 4 is a functional block diagram of an electronic memory system 401 including at least one memory device 420 having a FinFET in accordance with an embodiment of the present disclosure. Memory system 401 includes a processor 410 coupled to a memory device 420 that includes a memory array 400 of memory cells. The memory device 420 can include an array 400 of non-volatile memory cells, e.g., floating gate memory cells, which can be arranged in a NAND architecture or a NOR architecture.

The memory system 401 can include separate integrated circuits or both the processor 410 and the memory device 420 can be on the same integrated circuit. The processor 410 can be a microprocessor or some other type of controlling circuitry such as an application-specific integrated circuit (ASIC).

The embodiment of FIG. 4 includes address circuitry 440 to latch address signals provided over I/O connections 462 through I/O circuitry 460. Address signals are received and decoded by a row decoder 444 and a column decoder 446 to access the memory array 400. In light of the present disclosure, it will be appreciated by those skilled in the art that the number of address input connections depends on the density and architecture of the memory array 400 and that the number of addresses increases with both increased numbers of memory cells and increased numbers of memory blocks and arrays.

The memory device 420 reads data in the memory array 400 by sensing voltage and/or current changes in the memory array columns using sense/buffer circuitry that in this embodiment can be read/latch circuitry 450. The read/latch circuitry 450 can read and latch a page or row of data from the memory array 400. I/O circuitry 460 is included for bi-directional data communication over the I/O connections 462 with the processor 410. Write circuitry 455 is included to write data to the memory array 400.

Control circuitry 470 decodes signals provided by control connections 472 from the processor 410. These signals can include chip signals, write enable signals, and address latch signals that are used to control the operations on the memory array 400, including data read, data write, and data erase operations. In one or more embodiments, the control circuitry 470 is responsible for executing instructions from the processor 410 to perform the operating embodiments of the present disclosure. The control circuitry 470 can be a state machine, a sequencer, or some other type of controller. It will be appreciated by those skilled in the art that additional circuitry and control signals can be provided, and that the memory device detail of FIG. 4 has been reduced to facilitate ease of illustration.

Figure 5:
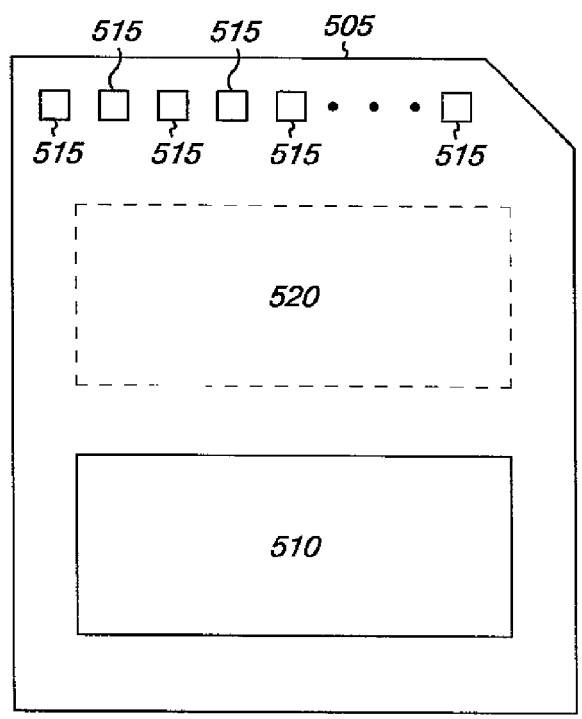
FIG. 5 is a functional block diagram of a memory module having at least one memory device in accordance with an embodiment of the present disclosure.

FIG. 5 is a functional block diagram of a memory module 500 including at least one memory device having a FinFET in accordance with an embodiment of the present disclosure. Memory module 500 is illustrated as a memory card, although the concepts discussed with reference to memory module 500 are applicable to other types of removable or portable memory (e.g., USB flash drives) and are intended to be within the scope of "memory module" as used herein. In addition, although one example form factor is depicted in FIG. 5, these concepts are applicable to other form factors as well.

In one or more embodiments, memory module 500 will include a housing 505 (as depicted) to enclose one or more memory devices 510, though such a housing is not essential to all devices or device applications. At least one memory device 510 includes an array of non-volatile memory cells and fuse circuitry that can be operated according to embodiments described herein. Where present, the housing 505 includes one or more contacts 515 for communication with a host device. Examples of host devices include digital cameras, digital recording and playback devices, PDAs, personal computers, memory card readers, interface hubs and the like. For one or more embodiments, the contacts 515 are in the form of a standardized interface. For example, with a USB flash drive, the contacts 515 might be in the form of a USB Type-A male connector. For one or more embodiments, the contacts 515 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520, which may be one or more integrated circuits and/or discrete components. For one or more embodiments, the additional circuitry 520 may include control circuitry, such as a memory controller, for controlling access across multiple memory devices 510 and/or for providing a translation layer between an external host and a memory device 510. For example, there may not be a one-to-one correspondence between the number of contacts 515 and a number of 510 connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC. Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

Methods, devices and systems for a FinFET are provided. One method embodiment includes forming a FinFET by forming a relaxed silicon germanium ($Si_{1-x}Ge_x$) body region for a fully depleted Fin field effect transistor (FinFET) having a body thickness of at least 10 nanometers (nm) for a process design rule of less than 25 nm. The method also includes forming a source and a drain on opposing ends of the body region, wherein the source and the drain are formed with halo ion implantation and forming a gate opposing the body region and separated therefrom by a gate dielectric.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, one or more features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A FinFET, comprising:
    a fully depleted, relaxed silicon germanium ($Si_{1-x}Ge_x$) body region, wherein the body region has a body thickness of at least 10 nanometers (nm) for a process design rule of less than 25 nm;
    a channel formed in a sidewall of the body region, wherein the sidewall is epitaxially strained;
    a metal gate opposing the channel and separated therefrom by a dielectric material having a dielectric constant (K) greater than 12;
    a source and a drain; and
    a halo ion implant underneath the source and the drain.

2. The FinFET of claim 1, wherein the channel has a width of less than 35 nm and a length of less than 25 nanometers.

3. The FinFET of claim 1, wherein the FinFET is a NMOS FinFET and wherein the sidewall is under biaxial tensile strain from a layer of Silicon (Si) formed on the relaxed silicon germanium ($Si_{1-x}Ge_x$) body region sidewall.

4. The FinFET of claim 3, wherein the layer of Silicon (Si) includes a thickness of approximately 6 nm.

5. The FinFET of claim 1, wherein the FinFET is a PMOS FinFET and wherein the sidewall is under biaxial compressive strain from a layer of Germanium (Ge) formed on the relaxed silicon germanium ($Si_{1-x}Ge_x$) body region sidewall.

6. The FinFET of claim 5, wherein the layer of Germanium (Ge) includes a thickness of approximately 12 nm.

7. The FinFET of claim 1, wherein the source and the drain are a p-type source and drain having a Boron (B) dopant at a concentration of $2 \times 10^{20}$ atoms/cm$^3$; and
    the halo ion implant underneath the p-type source and drain has a concentration of approximately $2 \times 10^{18}$ atoms/cm$^3$.

8. The FinFET of claim 1, wherein the source and the drain are a n-type source and drain having a Arsenic (As) dopant at a concentration of $2 \times 10^{20}$ atoms/cm$^3$; and
    the halo ion implant underneath the n-type source and drain has a concentration of approximately $2 \times 10^{18}$ atoms/cm$^3$.

9. The FinFET of claim 1, wherein the body region includes the relaxed silicon germanium ($Si_{1-x}Ge_x$) with X in a range of 0.5 to 0.6.

10. A FinFET, comprising:

a relaxed silicon germanium ($Si_{1-x}Ge_x$) body region;

an epitaxially grown germanium (Ge) layer on a sidewall on the body region, wherein the germanium layer on the sidewall of the body region provides biaxial compressive strain to the body region;

a gate opposing the body region and separated therefrom by a gate dielectric;

a source including a source extension and a drain including a drain extension; and a halo ion implant underneath the source extension, the drain extension, a first portion of the gate, and a second portion of the gate.

11. The FinFET of claim 10, wherein the gate dielectric has a dielectric constant (K) greater than 12.

12. The FinFET of claim 10, wherein the gate is polysilicon.

13. A FinFET, comprising:

a relaxed silicon germanium ($Si_{1-x}Ge_x$) body region;

an epitaxially grown layer of silicon (Si) formed on the relaxed silicon germanium ($Si_{1-x}Ge_x$) body region sidewall, wherein the Si layer on the sidewall of the body region provides biaxial tensile strain to the body region;

a gate opposing the body region and separated therefrom by a gate dielectric;

a source including a source extension and a drain including a drain extension; and a halo ion implant underneath the source extension, the drain extension, a first portion of the gate, and a second portion of the gate.

14. The FinFET of claim 13, wherein the source and the drain are on opposing ends of the body region.

15. The FinFET of claim 13, wherein the gate dielectric has a dielectric constant (K) greater than 12.

16. The FinFET of claim 13, wherein the gate is polysilicon.

17. The FinFET of claim 14, wherein the FinFET includes an annealed source and the drain.

* * * * *